(12) United States Patent
Lachner et al.

(10) Patent No.: US 8,814,134 B2
(45) Date of Patent: Aug. 26, 2014

(54) PIEZOELECTRIC DRIVE AND MICROVALVE COMPRISING SAID DRIVE

(75) Inventors: Hubert Lachner, Freising-Hohenbachern (DE); Michael Foerg, Freising-Sunz-Hausen (DE); Norbert Schwesinger, Ilmenau (DE); Sebastian Pobering, Erfurt (DE); Sandy Zaehringer, Dachau (DE)

(73) Assignees: Hubert Lachner (DE); Michael Foerg (DE)

( * ) Notice: Subject to any disclaimer, the term of this patent is extended or adjusted under 35 U.S.C. 154(b) by 260 days.

(21) Appl. No.: 13/265,965

(22) PCT Filed: Apr. 20, 2010

(86) PCT No.: PCT/EP2010/055186
§ 371 (c)(1), (2), (4) Date: Oct. 24, 2011

(87) PCT Pub. No.: WO2010/122016
PCT Pub. Date: Oct. 28, 2010

(65) Prior Publication Data
US 2012/0043485 A1   Feb. 23, 2012

(30) Foreign Application Priority Data
Apr. 24, 2009  (DE) .......................... 10 2009 002 631

(51) Int. Cl.
*F16K 31/02* (2006.01)
(52) U.S. Cl.
USPC ..................................... 251/129.06; 251/331
(58) Field of Classification Search
USPC ........... 251/129.06, 331; 239/102.2; 123/498; 310/326, 327, 317, 323.06, 365, 366, 310/369, 368
See application file for complete search history.

(56) References Cited

U.S. PATENT DOCUMENTS

| | | | | |
|---|---|---|---|---|
| 3,114,849 A | * | 12/1963 | Poschenrieder | 310/330 |
| 3,311,760 A | * | 3/1967 | Durgin et al. | 310/321 |
| 3,535,686 A | * | 10/1970 | Barnett | 365/65 |
| 4,581,624 A | * | 4/1986 | O'Connor | 251/129.06 |

(Continued)

FOREIGN PATENT DOCUMENTS

| | | |
|---|---|---|
| EP | 0841708 A1 | 5/1998 |
| JP | 01041283 A | 2/1989 |

OTHER PUBLICATIONS

Hong E., et al., "Micromachined piezoelectric diaphragms actuated by ring shaped interdigitated transducer electrodes" Sensors and Actuators A., vol. 119, No. 2, Apr. 13, 2005, pp. 520-526.

*Primary Examiner* — John K Fristoe, Jr.
*Assistant Examiner* — Seth W Mackay-Smith
(74) *Attorney, Agent, or Firm* — Mark D. Wieczorek; Mayer & Williams PC

(57) ABSTRACT

The invention relates to a piezoelectric drive, in particular for microvalves. The drive comprises a deformation layer coupled on one side to a piezoelectric layer, which is provided with at least one pair of electrodes, made of two electrodes of opposite polarities, to provide electricity. According to the invention, both electrodes of opposite polarities of the pair of electrodes are arranged together on the side of the piezoelectric layer facing away from the deformation layer. The invention also relates to a microvalve comprising at least one valve channel and a membrane that opens or closes the valve channel, where the membrane simultaneously forms the deformation layer of such a piezoelectric drive.

9 Claims, 4 Drawing Sheets

(56) References Cited

U.S. PATENT DOCUMENTS

| | | | |
|---|---|---|---|
| 4,888,598 A * | 12/1989 | Heinzl et al. | 347/70 |
| 5,374,863 A * | 12/1994 | Mochizuki et al. | 310/313 D |
| 6,091,182 A * | 7/2000 | Takeuchi et al. | 310/330 |
| 6,323,580 B1 * | 11/2001 | Bernstein | 310/324 |
| 6,404,103 B1 * | 6/2002 | Suzuki et al. | 310/323.01 |
| 6,505,811 B1 * | 1/2003 | Barron et al. | 251/129.01 |
| 6,690,100 B1 * | 2/2004 | Koroishi et al. | 310/323.03 |
| 6,856,073 B2 * | 2/2005 | Bryant et al. | 310/324 |
| 6,919,669 B2 * | 7/2005 | Bryant et al. | 310/366 |
| 7,161,279 B2 * | 1/2007 | Topliss et al. | 310/330 |
| 7,290,336 B2 * | 11/2007 | Buhler et al. | 29/890.1 |
| 7,932,663 B2 * | 4/2011 | Yoon et al. | 310/359 |
| 8,604,667 B2 * | 12/2013 | Iino et al. | 310/323.02 |
| 2007/0252485 A1 * | 11/2007 | Kawakubo et al. | 310/365 |

\* cited by examiner

PIEZOELECTRIC DRIVE AND MICROVALVE COMPRISING SAID DRIVE

BACKGROUND OF THE INVENTION

The present invention relates to a piezoelectric drive having a deformation layer which is coupled on one side to a piezoelectric layer, which is provided, for the electrical power supply, with at least one pair of electrodes made of two electrodes of opposite polarities. Such a drive is particularly, although not exclusively, suitable for the adjustment of a microvalve, wherein the membrane of said valve forms the deformation layer of the piezoelectric drive. Microvalves and the associated drives are used in the field of microfluidics to control fluid or gas flows. Here, the microvalves usually adopt only an open or closed state, so they have an on/off function. For the control of a throughput quantity, such microvalves can be operated in cycles with short cycle times. The setting element of the microvalve is here formed by a membrane which, in case of appropriate displacement, opens or closes a valve channel. In conventional microvalves, the fluid path through the valve channel is normally interrupted in the non-displaced state of the membrane. A microdrive is required for the displacement of the membrane.

In microtechnology, electrostatic and piezoelectric drives are used. Piezoelectric drives are based on the sufficiently-known piezoelectric principle, where the application of an electric voltage to a piezoceramic causes a change in the length of the material. When the so-called longitudinal effect is used, a deformation of the piezo material, which can be used as drive, occurs in a direction which is in agreement with the direction of the electric field between two electrodes of opposite polarities. So-called high-power piezoelectric materials (PZT), which exhibit a change in length, the size of which is relatively large given the material thickness, are based on this longitudinal effect, in which the polarization direction of the piezo material is in agreement with the electrical field direction. For example, to move a membrane using such a drive, the piezo material is firmly mounted on one side, and on the other side it is connected to the membrane.

In these applications, the achievable adjustment distance is approximately $1/1000$ of the thickness of the piezo material. To achieve a mechanical lift of 1 μm, a piezo material thickness of at least 1 mm is consequently needed. If a larger mechanical lift is needed, the piezo material thicknesses increases accordingly, which has negative consequences for the use of these drives in microtechnology. Moreover, actuation voltages with a field strength of approximately 3000 V/mm are needed to supply the piezoelectric material, which, in microtechnological applications, can rapidly lead to undesired electrical flashover. The control devices needed for such actuation voltages are difficult to integrate in microtechnological solutions.

In EP 0 914 563 B1, a piezoelectrically actuated microvalve is described, which uses the mentioned longitudinal piezoelectric effect. In the process, a piezoelectric actuation device is coupled to the frame of a suspension device. The suspension device also carries a ram which closes a passage opening in the valve. When a voltage is applied to the piezoelectric actuation device, a change in the length of the piezo material occurs, which results in a deformation of the suspension device, which shifts the ram perpendicularly to the length change of the piezo material.

Piezoelectric materials moreover exhibit the so-called transverse effect which causes a deformation of the piezo material perpendicularly to the direction of the electrical field between the electrodes. When a voltage is applied to the piezo material, the latter contracts transversely to the field direction. The deformation achievable by the transverse effect is in all cases smaller than $1/1000$ of the piezo material expansion.

DE 36 18 107 A1 discloses an ink writing head with piezo-electrically excitable membrane, where the drive makes use of the mentioned piezoelectric transverse effect. The drive of the membrane is implemented by a typical layer design. A metal supporting layer is attached to a ground substrate, and it extends over a fluid conveying channel opening. The metal supporting layer carries a polarized layer made of piezoceramic on the side facing away from the channel opening. The supporting layer acts as a ground electrode for the generation of the electrical field which excites the piezo material. On the opposite side of the piezoceramic, actuation electrodes are provided, which allow a locally-delimited activation of the piezo material. The required electrical field is thus generated between the ground electrode and the respective actuation electrode, which are positioned on opposite sides of the piezo material. To actuate the electrodes, a deformation of the piezoelectric ceramic layer and of the metal supporting layer attached thereto occurs, which functions as a membrane. Due to the special arrangement of the multiple actuation electrodes, a deformation of the supporting layer in the direction towards the piezo material can be achieved. However, for this purpose, field directions that are directed in the opposite direction of the polarization direction in the piezo material must be generated in certain regions. Operating a piezo material against the polarization direction leads, as experience has shown, to a depolarization of the piezo material, which in the medium term leads to a loss of the piezoelectric properties. Another problem is that the metal supporting layer is in direct contact with the fluid in the channel to be controlled, which can lead to corrosion of the supporting layer, and to electrical problems. Consequently, such a design is not desirable for many microtechnological applications.

U.S. Pat. No. 6,222,304 B1 discloses a shell transducer which can be designed, for example, to move a fluid or solid medium. An electroactive medium in the form of a piezoelectric layer is arranged, for example, above a buffer layer made of $ZrO_2$ which should undergo deformation together with the electroactive medium. Current from two electrodes flows through the electro active medium.

From U.S. Pat. No. 5,255,016, a printer head for an ink jet printer is known. The printer head has vibrating plates which function as pumps for the ink. The vibrating plates are made of a piezoelectric material. Two electrodes are applied to a surface of the piezoelectric material.

SUMMARY OF THE INVENTION

One problem of the present invention consists in providing a piezoelectric drive which is suitable particularly for microtechnological applications, and which enables the coupling of a piezoelectric layer to a deformation layer, particularly a membrane which does not have to take over any electrode functions for the actuation of the piezo material. A part of the problem consists moreover in providing a microvalve having a membrane, where the membrane, in case of activation of a coupled piezoelectric layer, is deformable with an appreciable lift, and consists at the same time of a material which does not take over the function of an electrode for the piezoelectric layer.

This problem is solved first by a piezoelectric drive having the characteristics of the accompanying Claim 1. This drive is characterized particularly in that the two electrodes of opposite polarities, which are needed for generating an electrical field extending through the piezoelectric material, are applied on the same side of the piezoelectric layer, namely on the side of the piezoelectric layer facing away from the deformation layer. The conventional layer structure, in which the piezoelectric layer is enclosed between two electrode layers, is abandoned according to the invention. By the arrangement of electrodes of opposite polarities on a common side of the piezoelectric layer, a superposition of longitudinal and transverse effects is achieved, which results in expansion in terms of surface extent of the piezoelectric layer.

A preferred embodiment is characterized in that the electrodes cover the piezoelectric layer substantially completely. In particular, it is advantageous if the outer delimitation of the piezoelectric layer is substantially congruent with the outer delimitation of the applied electrodes. Indeed, it has been shown that the desired, outwardly directed, deformation of the piezoelectric layer, which can be transferred on the side facing the electrodes to the deformation layer, occurs predominantly in areas covered by the electrodes. In areas which are at a distance from the electrodes, the outwardly-directed deformation of the piezoelectric layer decreases progressively. Preferred embodiments therefore have a piezoelectric layer which extends by not more than twice the width of the outer electrode over the surface covered by the electrode structures. Equally, it is advantageous if the surfaces remaining between the electrodes of opposite polarities, which surfaces are not covered by an electrode, are not greater than the average doubled width of the adjacent electrodes. It should be pointed out that the deformation layer applied on the facing side of the piezoelectric layer could obviously be larger in terms of surface extension than the piezoelectric layer or the surface covered by the electrodes.

The deformation layer can advantageously be made of nonelectrically conductive material, because it does not have to take over any electrode function. As a result, aggressive media may also come in contact with the deformation layer, without any risk of corrosion of the electrodes.

When actuating the electrodes in the polarization direction, the piezoelectric layer expands, so that a deformation layer or membrane coupled to the piezoelectric layer, depending on the design of the electrodes, is deformed either in the direction towards the piezoelectric layer or in a direction away from this layer.

The above-mentioned problem is solved furthermore by a microvalve according to the accompanying Claim 11. The membrane of the microvalve simultaneously forms the deformation layer of the mentioned piezoelectric drive. Due to the mentioned expansion of the piezoelectric layer when the electrodes are being actuated, the membrane can open a valve channel or fluid path, and close it off when the supply voltage is switched off. The arrangement of the electrodes moreover ensures that they do not come in contact with the fluid conveyed in the microvalve.

The electrodes of opposite polarities can be structured differently, and they are preferably designed in the form of numerous strips having alternating polarity and extending next to each other. In the case of circular piezoelectric layers, the electrodes extend, for example, in a ray pattern in the radial direction. To obtain as uniform as possible a field strength course, numerous electrode sections can extend substantially parallel to each other. A parallel electrode course that is parallel in sections can also be achieved by using sinusoidal electrode strips which cover the surface to be activated of the piezoelectric material.

In a preferred embodiment, the piezoelectric layer is applied directly on the deformation layer. This allows a loss-free force transmission, and makes possible the production of the piezoelectric drive using methods that are conventional in microtechnology.

Additional advantages, details and variants of the present invention result from the following description of preferred embodiments, in reference to the drawings.

DETAILED DESCRIPTION OF THE INVENTION

Figure 1:
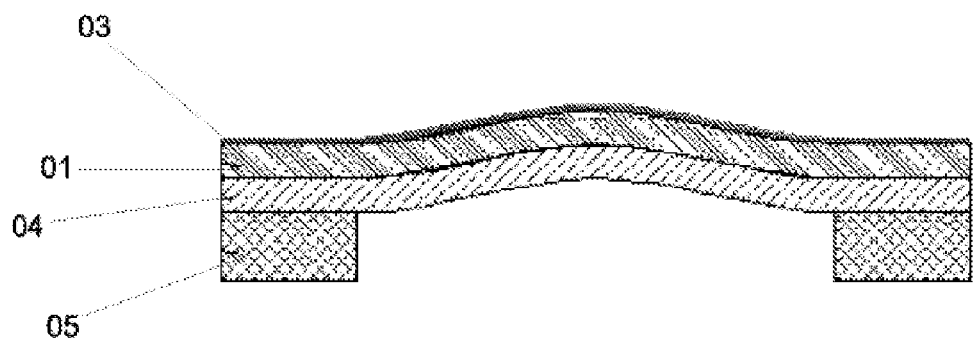
FIG. 1 is an elementary cross-sectional view of the basic body of a piezoelectric drive according to an embodiment of the invention.

FIG. 1 shows the elementary design of a piezoelectric drive according to an embodiment of the invention in cross section. A piezoelectric layer 01 acts as active drive element, and supports on the top side thereof at least one pair of electrodes 03 of opposite polarities to which a supply voltage is applied. It should be pointed out that an essential aspect of the invention is that the two electrodes forming the pair of electrodes 03 are arranged on a common side of the piezoelectric layer. A facing pair of electrodes as in the state of the art is not provided here. Rather, in the depicted example, on the side of the piezoelectric layer 01 facing away from the electrodes, a membrane 04 is arranged directly, which forms a deformation layer of the drive. The electrodes are preferably formed as groups of numerous individual electrode strips which are applied alternatingly on the surface to be activated of the piezoelectric layer.

The membrane 04 is attached in its marginal area to a membrane support 05 the design of which is annular in shape. If the piezoelectric drive is not used in a microvalve, other drive functions can be fulfilled via the deformation layer 04, for example, the positioning of an optical element.

The piezoelectric drive is shown in FIG. 1 in an activated state, i.e., above the pair of electrodes 03, a supply voltage is applied to the piezoelectric layer 01, which results in an expansion in terms of surface extent of the piezoelectric layer 01. This leads to a deformation of the piezoelectric layer and of the membrane 04 or deformation layer attached to it, in the direction towards the piezoelectric layer. Said deformation is achieved by generating an inhomogeneous electrical field which is generated due to a special structuring or arrangement of the electrodes. For this purpose, preferred embodiments are described below. However, it is pointed out that, due to a change in the mutual arrangement and the structuring of the electrodes, a deformation of the piezoelectric layer and of the membrane or deformation layer coupled to it in the opposite direction, that is towards the deformation layer, can also be achieved, which is also within the scope of the present invention.

Figure 2:
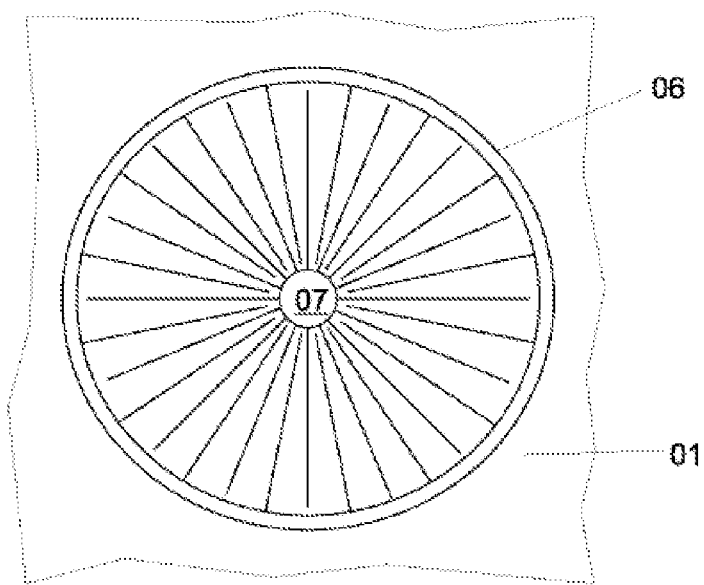
FIG. 2 is a diagrammatic top view of a piezoelectric layer of the drive with a ray-shaped pattern of electrodes, where one of the electrode groups is contacted via a connection located in the center.

FIG. 2 shows, in a diagrammatic top view, a first embodiment of the elementary structuring of the pair of electrodes on the top side of the piezoelectric layer 01. The numerous electrodes here extend as straight strips substantially radially between the center and the margin of the piezoelectric layer 01 and the membrane 04 lying beneath said layer. The electrodes are grouped to form two groups of different polarity, and they can thus be considered from the electrical point of view to be two electrodes divided into sections. Opposite each electrode having the first polarity there is an electrode having the second polarity, resulting in the generation of an electrical field, when a supply voltage is applied. Due to the distribution of the individual electrodes, this field is largely inhomogeneous. The electrodes consist of a material having a good electrical conductivity, and they can be produced by the usual methods of microtechnology.

The active surface of the piezoelectric layer 01 in the embodiment shown in FIG. 2 is designed in the shape of a circle, wherein the outer margin of the active area is defined by the membrane support 05 lying beneath it (FIG. 1), on which support the membrane 04 is clamped. The first electrodes of the pair of electrodes 03 start from an outer, circular contacting point 06, and the second electrodes start from a second contacting point 07 arranged in the center of the piezoelectric layer 01. The minimum electrode separation between the electrodes of opposite polarities must be sufficiently large everywhere, so that electrical flashover at the supply voltages used is prevented. By increasing the alternating electrode number, and consequently reducing the electrode separation, the required supply voltage can be reduced.

Figure 3:
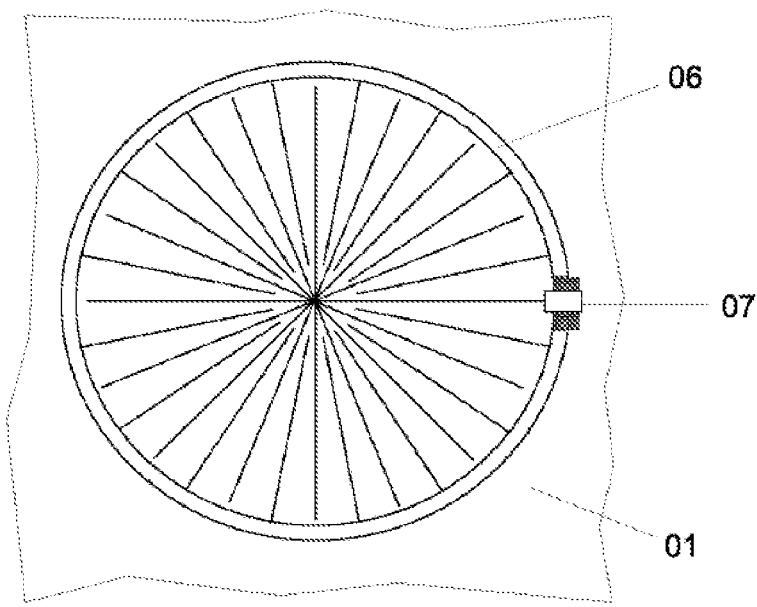
FIG. 3 is a diagrammatic top view of a second embodiment of the electrode arrangement on the piezoelectric layer with two electrode groups contacted in the outer region.

FIG. 3 shows a second embodiment of the structuring of the electrodes on the piezoelectric layer 01. In this embodiment, the first contacting point 06 again extends in the shape of a circle at the outer margin of the active area of the piezoelectric layer 01. The second contacting point 07 is also shifted away from the center into the outer marginal area. From the second contacting point 07, the applied voltage potential is led to the center, and from there it is distributed to the multiple second electrodes which again extend in a ray pattern towards the outside, alternatingly with respect to the first electrodes.

Figure 4:
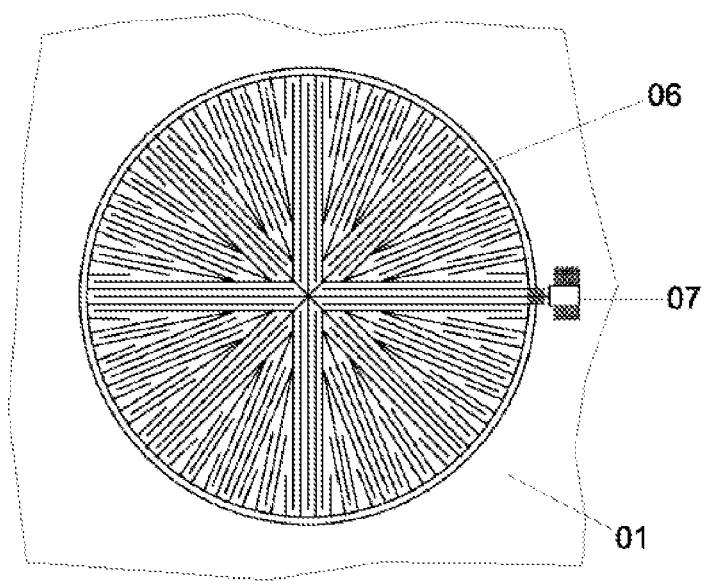
FIG. 4 is a diagrammatic top view of a third embodiment of the electrode structure with strip electrodes extending parallel to each other.

FIG. 4 shows a third embodiment of structured electrodes on the piezoelectric layer 01. In contrast to the two above-described embodiments, in which the electric field strengths between the electrodes decrease from the center towards the outer margin, due to the increasing electrode separation, field strengths that remain substantially the same can be generated here. For this purpose, strip electrodes that run parallel to each other are used, to which the supply voltage is again applied via the first and second contacting points 06, 07. Due to the plurality of electrode strips, a piezoelectric reaction of the piezo material layer lying beneath the electrodes occurs when the supply voltage is applied. Due to the interactions between the piezoelectric longitudinal and transverse effects, an expansion in terms of surface extent is caused beneath the electrodes.

Figure 5:
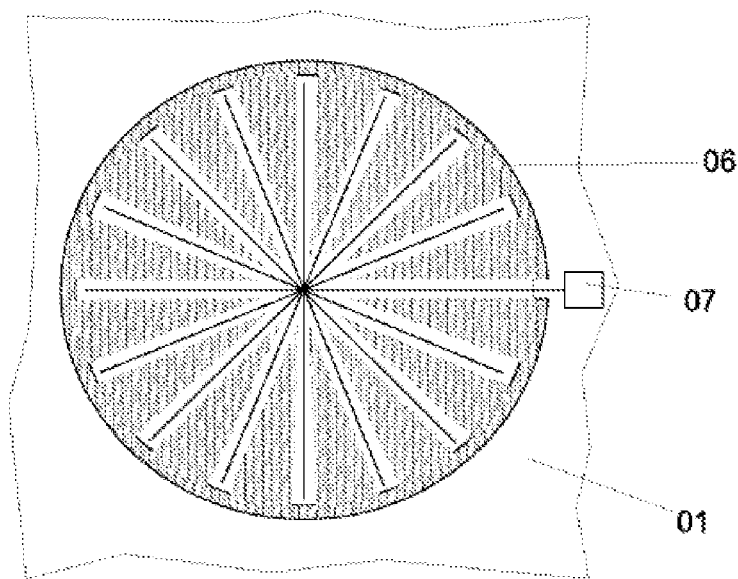
FIG. 5 is a diagrammatic top view of a fourth embodiment of the electrode structure of the piezoelectric layer with strip-shaped and wedge-shaped electrodes.

FIG. 5 shows a fourth embodiment of the electrode structure, in which the electrodes of opposite polarities are again opposite each other on parallel boundary surfaces. For this purpose, strip-shaped first electrodes are formed, which are connected to the first contacting point 06, and wedge-shaped second electrodes in intermediate position are formed, which are connected to the second contacting point 07.

To the extent that, instead of a piezoelectric layer and a circular membrane lying beneath said layer, another membrane geometry is given preference, the electrode structure needs to be adjusted. Strip-shaped electrodes can also be used, which are to be distributed on the active surface of the piezoelectric layer.

Figure 6:
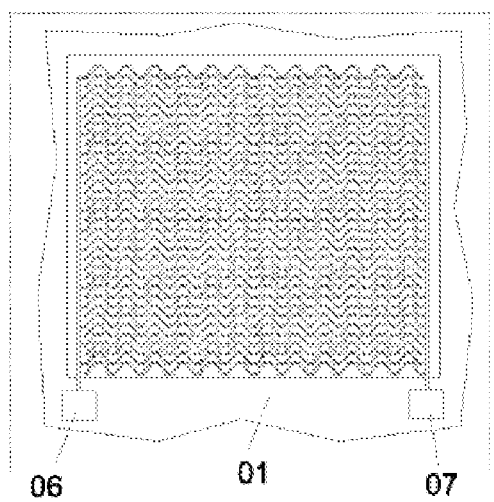
FIG. 6 is a diagrammatic top view of a fifth embodiment with sinusoidal electrode strips.

FIG. 6 shows in addition a fifth embodiment of the electrode structure which is applied to a rectangular piezoelectric layer 01, which is coupled to a membrane which is also rectangular. As already mentioned above, the supply voltage can be reduced if as many electrode sections extending parallel to each other as possible are implemented. In the represented embodiment, this occurs by means of sinusoidal electrodes which are arranged alternately, and supplied via the first or second contacting point 06, 07. As a result, large field strengths can be achieved in the vicinity of the surface, leading to large expansions of the surface-near regions in the piezoelectric layer.

Due to the arrangement according to the invention of the two electrode groups on the same side of the piezoelectric layer, an inhomogeneous electrical field can be generated. The inhomogeneous field distribution leads to different expansions and contractions in the entire area of the piezoelectric layer that is penetrated by the field. If the electrodes are arranged in the described manner, the longitudinal effect predominates in the piezo material, leading to an expansion of these regions. The thickness of the piezoelectric material here plays only a secondary role, because the generated electrical field penetrates to only low depths of the piezo material, so that hardly any piezoelectric effects occur in material regions that are not influenced by the electrical field.

Figure 7:
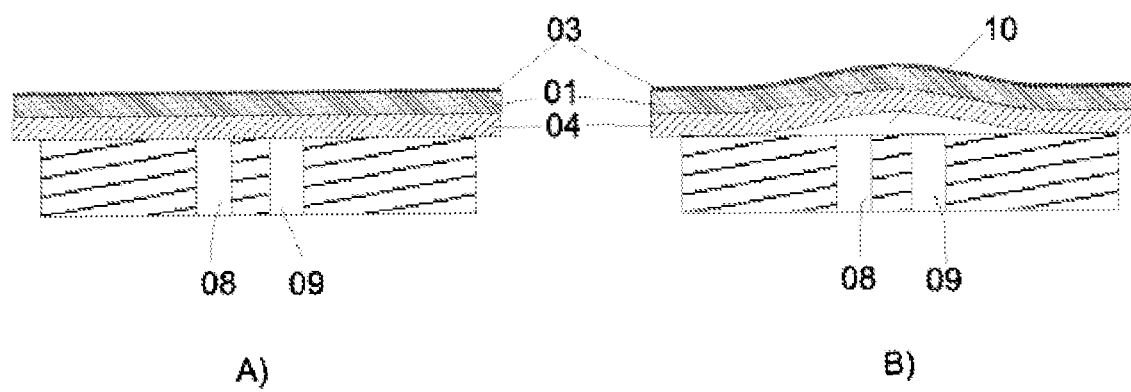
FIG. 7 illustrates two elementary cross-sectional views of a microvalve with the piezoelectric drive according to an embodiment of the invention in an open and a closed position.

FIG. 7 shows two cross-sectional views of the elementary design of a microvalve which uses the above-explained piezoelectric drive. In Figure A), the microvalve is shown in the closed state, while in Figure B), the valve is shown in the opened state. The membrane 04, and the piezoelectric layer 01 attached to the membrane, cover an inlet channel 08 and an outlet channel 09 of the valve. In the closed state, the two channels are closed by the membrane 04, so that no fluid can flow between the inlet channel and the outlet channel. When the piezoelectric layer 01 is activated, the described surface expansion occurs, so that the membrane 04 bends in the direction towards the piezoelectric layer 01, thus opening the channels 08, 09. A fluid to be controlled can flow between the channels through a forming valve space 10.

It is evident to the person skilled in the art that various microvalves can be constructed using the piezoelectric drive according to the invention. Equally, the piezoelectric device is usable for other drive types.

The invention claimed is:

1. A piezoelectric drive for microvalves, comprising: a deformation layer coupled on one side to a piezoelectric layer, and at least one pair of electrodes made of two electrodes of opposite polarities, the two electrodes of opposite polarities arranged together on the side of the piezoelectric layer facing away from the deformation layer, the two electrodes of opposite polarities for coupling to an electrical power supply, wherein the electrodes of opposite polarities are arranged as sinusoidal strips having alternating polarity.

2. The piezoelectric drive according to claim 1, wherein the two electrodes of opposite polarities are formed by numerous strips having alternating polarity and extending next to each other.

3. The piezoelectric drive according to claim 1, wherein the two electrodes of opposite polarities are structured in such a manner that when a voltage is applied, a deformation of the piezoelectric layer in a direction opposite the position of the deformation surface results.

4. The piezoelectric drive according to claim 1, wherein the deformation layer consists of an electrically nonconductive material.

5. The piezoelectric drive according to claim 1, wherein numerous electrodes of opposite polarities extend parallel to each other on the side of the piezoelectric layer facing away from the deformation layer.

6. The piezoelectric drive according to claim 1, wherein numerous electrodes of opposite polarities are applied on the side of the piezoelectric layer facing away from the deformation layer, in such a manner that an inhomogeneous electrical field forms in the surface-near area of the piezoelectric layer.

7. A microvalve comprising at least one valve channel and a membrane which opens or closes the valve channel, wherein the membrane at the same time forms the deformation layer of a piezoelectric drive according to claim 1.

8. The microvalve according to claim 7, wherein, when the piezoelectric drive is not activated, the membrane is in the undeformed state and closes the valve channel and, to open the valve channel, the membrane is deformed away from the valve channel by an activation of the drive.

9. The microvalve according to claim 8, wherein the piezoelectric layer of the drive is arranged on a side of the membrane facing away from the valve channel.

* * * * *